US010607617B2

(12) United States Patent
Kawashima et al.

(10) Patent No.: US 10,607,617 B2
(45) **Date of Patent: *Mar. 31, 2020**

(54) ENCODING APPARATUS AND ENCODING METHOD

(71) Applicant: Fraunhofer-Gesellschaft zur Foerderung der angewandten Forschung e.V., Munich (DE)

(72) Inventors: Takuya Kawashima, Ishikawa (JP); Masahiro Oshikiri, Osaka (JP)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/195,758

(22) Filed: Nov. 19, 2018

(65) Prior Publication Data

US 2019/0130924 A1 May 2, 2019

Related U.S. Application Data

(63) Continuation of application No. 15/263,534, filed on Sep. 13, 2016, now Pat. No. 10,134,410, which is a (Continued)

(30) Foreign Application Priority Data

Oct. 28, 2011 (JP) ................................ 2011-237818

(51) Int. Cl.

| | |
|---|---|
| ***G10L 19/02*** | (2013.01) |
| ***G10L 25/06*** | (2013.01) |
| ***G10L 21/0388*** | (2013.01) |

(52) U.S. Cl.

CPC ...... *G10L 19/0204* (2013.01); *G10L 19/0208* (2013.01); *G10L 19/0212* (2013.01);

(Continued)

(58) Field of Classification Search

CPC ....................................................... G10L 19/02

See application file for complete search history.

(56) References Cited

U.S. PATENT DOCUMENTS 5,303,346 A 4/1994 Fesseler et al.
5,806,024 A 9/1998 Ozawa (Continued)

FOREIGN PATENT DOCUMENTS

JP 2006163396 A 6/2006
JP 2009515212 A 4/2009

(Continued)

OTHER PUBLICATIONS

"G.729, Annex E", ITU-T, 2008, pp. 1-69.
"G.718, Annex B", ITU-T, 2008, pp. 1-69.

*Primary Examiner* — Douglas Godbold

(74) *Attorney, Agent, or Firm* — Michael A. Glenn; Perkins Coie LLP

(57) ABSTRACT

A coding apparatus, including a memory and a processor that, when executing instructions stored in the memory, performs operations including encoding low-band transform coefficients in a first band and calculating, for each extension-band subband obtained by splitting an extension band, a threshold amplitude based on an analysis of statistics on extension-band transform coefficients included in the subband. The processor further compares, for each of the extension-band subbands, an amplitude of the extension-band transform coefficients with the threshold amplitude to extract a representative transform coefficient, updates, when a number of the extracted representative transform coefficients is less than a predetermined number, the threshold amplitude, performs processing to again extract a transform coefficient using the updated threshold amplitude, calculates, for each of the extension-band subbands, a value of (Continued)

correlation between the representative transform coefficient and a normalized encoded low-band transform coefficient.

5 Claims, 6 Drawing Sheets

Related U.S. Application Data continuation of application No. 15/079,524, filed on Mar. 24, 2016, now Pat. No. 9,472,200, which is a continuation of application No. 14/350,403, filed as application No. PCT/JP2012/006541 on Oct. 12, 2012, now Pat. No. 9,336,787.

(52) U.S. Cl.

CPC .......... *G10L 21/0388* (2013.01); *G10L 25/06* (2013.01); *H05K 999/99* (2013.01)

(56) References Cited

U.S. PATENT DOCUMENTS

| | | | | |
|---|---|---|---|---|
| 5,983,172 | A | 11/1999 | Takashima et al. | |
| 9,336,787 | B2 * | 5/2016 | Kawashima | G10L 19/0204 |
| 9,472,200 | B2 * | 10/2016 | Kawashima | G10L 19/0204 |
| 2006/0116871 | A1 * | 6/2006 | Kim | G10L 19/0204 704/216 |
| 2008/0052066 | A1 | 2/2008 | Oshikiri et al. | |
| 2009/0271204 | A1 * | 10/2009 | Tammi | G10L 19/0208 704/500 |
| 2012/0095754 | A1 | 4/2012 | Lee et al. | |
| 2013/0110522 | A1 | 5/2013 | Choo et al. | |

FOREIGN PATENT DOCUMENTS

| | | | |
|---|---|---|---|
| WO | 2011000408 | A1 | 1/2011 |
| WO | 2012016110 | A2 | 2/2012 |

* cited by examiner

ENCODING APPARATUS AND ENCODING METHOD

CROSS-REFERENCE TO RELATED APPLICATIONS

The present application is a continuation of pending U.S. application Ser. No. 15/263,534 filed Sep. 13, 2016, which is a continuation of U.S. application Ser. No. 15/079,524 filed Mar. 24, 2016, now U.S. Pat. No. 9,472,200 issued Oct. 18, 2016, which is a continuation application of U.S. patent application Ser. No. 14/350,403, filed Apr. 8, 2014, now U.S. Pat. No. 9,336,787 issued May 10, 2016, which is a National Stage Application of International Patent Application No. PCT/JP2012/006541, filed Oct. 12, 2012, the contents of which are expressly incorporated by reference herein in their entireties.

TECHNICAL FIELD

The present invention relates to a coding apparatus and a coding method.

BACKGROUND ART

The methods disclosed in NPL 1 and NPL 2, which have been standardized by ITU-T, are known as coding schemes enabling efficient coding of sound-related data such as speech data in the Super-Wide-Band (SWB, usually a band of 0.05-14 kHz). In these methods, sounds in a band of 7 kHz or lower (hereinafter referred to as a "low band") are encoded by a core coding section and sounds in a band of 7 kHz or higher (hereinafter referred to as an "extension band") are encoded by an extension coding section.

CELP (Code Excited Linear Prediction) is used in coding processing by the core coding section. The extension coding section decodes a low-band signal encoded by the core coding section, transforms it into the frequency domain by using MDCT (Modified Discrete Cosine Transform), and makes use of the obtained spectra (or transform coefficients; hereinafter referred to as "transform coefficients") in encoding in the extension band.

The extension coding section uses the "envelope" of spectral power to normalize the core encoded low-band transform coefficients generated by the core coding section. In particular, the extension coding section calculates energy in each subband, smoothens out the subband energy to make a variation of the energy smooth in the direction of the frequency domain, and normalizes the transform coefficients in each subband with the smoothened energy. The normalized transform coefficients obtained in this manner are hereinafter referred to as "normalized low-band transform coeficients."

The extension coding section searches for a subband having a large value of correlation between the normalized low-band transform coefficients and transform coefficients from an input signal in the extension band (hereinafter referred to as "extension-band transform coefficients") and encodes information indicating the subband as lag information. The extension coding section copies the normalized low-band transform coefficients in the subband having a large value of correlation to the extension band and utilizes the copied normalized low-band transform coefficients as a spectral fine structure of the extension band. Thereafter, the extension coding section calculates a gain to adjust energy of the extension-band transform coefficients and encodes the gain. The coding apparatuses according to the related art perform the above-described processing to generate transform coefficients in the extension band using transform coefficients in the low band.

The value of correlation between the normalized low-band transform coefficients and the extension-band transform coefficients is calculated in the following manner in NPL 1 and NPL 2.

First, the extension band is divided into a plurality of subbands (hereinafter referred to as "extension-band subbands"). Next, for each extension-band subband, a value of correlation between the normalized low-band transform coefficients and the transform coefficients in the extension-band subband is calculated. Then, a position of the normalized low-band transform coefficients where the value of correlation with the extension-band subband becomes largest is searched. However, calculating the value of correlation in this manner has a problem in that the method involves a large amount of calculation because the normalized low-band transform coefficients and all the transform coefficients in the extension-band subband are used for the calculation.

As a solution to this problem, PTL 1 discloses a technique in which the value of correlation is calculated by using only large transform coefficients in terms of amplitude among the extension-band transform coefficients. Accordingly, the amount of calculation for calculating the value of correlation can be reduced by limiting the number of transform coefficients used in the calculation of the value of correlation.

CITATION LIST

Patent Literature

PTL 1
International Publication No. WO2011/000408

Non-Patent Literature

NPL 1
ITU-T Standard Q 718 AnnexB, 2008
NPL 2
ITU-T Standard (1729.1 AnnexB, 2008

SUMMARY OF INVENTION

Technical Problem

The technique disclosed in PTL 1, however, requires a large amount of calculation for extracting transform coefficients, which diminishes the effect of reduction in the amount of calculation by limiting the number of transform coefficients. For example, if an extension-bend subband includes M transform coefficients, and largest N transform coefficients in terms of amplitude are to be extracted from among the M transform coefficients, branching processing has to be performed at least M×N times, leading to a large amount of calculation.

As another way of extracting transform coefficients having a large amplitude, PTL 1 illustrates a technique in which the mean value and the standard deviation of extension-band transform coefficients are calculated, a threshold is set based on these parameters, and then transform coefficients that exceed the threshold are extracted.

However, since speech and music have complex characteristics in a high band, a narrow subband width has to be set to generate high quality sound. Accordingly, the number of transform coefficients included in an extension-band subband becomes inevitably small, which makes it difficult to set a statistically reliable threshold. For this reason, it is difficult to obtain a threshold that enables extraction of a desired number of transform coefficients. For example, if the threshold is too high, the number of extracted transform coefficients becomes small, so that accuracy of the calculated value of correlation decreases, which makes it no longer possible to determine an appropriate position. On the contrary, if the threshold is too low, the number of extracted transform coefficients becomes large, so that the amount of calculation for calculating a value of correlation cannot be reduced drastically. Moreover, the number of extracted transform coefficients reaches the predetermined number N in the middle of the extraction loop, so that transform coefficients having a large amplitude in the rest of the loop may not be extracted.

An object of the present invention is to provide a coding apparatus and a coding method for extracting an appropriate number of transform coefficients that can reduce the amount of calculation for extracting the transform coefficients, drastically.

Solution to Problem

A coding apparatus according to an aspect of the present invention includes: a core coding section that encodes transform coefficients in a band lower than a reference frequency among input signal transform coefficients obtained by transforming an input signal from a time domain to a frequency domain; and an extension-band coding section that encodes transform coefficients in an extension band by using core encoded low-band transform coefficients obtained by decoding data encoded by the core coding section, the extension band being a band higher than the reference frequency, in which the extension-band coding section includes: a threshold calculation section that calculates, for each of extension-band subbands obtained by splitting the extension band, a threshold based on statistics on transform coefficients included in the subband; a representative transform coefficient extraction section that compares, for each of the extension-band subbands, an amplitude of the transform coefficients with the threshold to extract a transform coefficient having an amplitude larger than the threshold, as a representative transform coefficient; and a matching section that calculates, for each of the extension-band subbands, a value of correlation between the representative transform coefficient and a normalized core encoded low-band transform coefficient and selects a subband having a largest value of correlation, in which: when a number of the representative transform coefficients extracted by the representative transform coefficient extraction section is less than a predetermined number, the threshold calculation section updates the threshold in accordance with a shortage number of the representative transform coefficients with reference to the predetermined number; and the representative transform coefficient extraction section performs processing to extract a transform coefficient again by using the updated threshold.

A coding method according to an aspect of the present invention includes: a core coding step of encoding transform coefficients in a band lower than a reference frequency among input signal transform coefficients obtained by transforming an input signal from a time domain to a frequency domain; and an extension-band coding step of encoding transform coefficients in an extension band by using core encoded low-band transform coefficients obtained by decoding data encoded in the core coding step, the extension band being a band higher than the reference frequency, in which the extension-band coding step includes: calculating, for each of extension-band subbands obtained by splitting the extension band, a threshold based on statistics on transform coefficients included in the subband; comparing, for each of the extension-band subbands, an amplitude of the transform coefficients with the threshold to extract a transform coefficient having an amplitude larger than the threshold as a representative transform coefficient; when a number of the extracted representative transform coefficients is less than a predetermined number, updating the threshold in accordance with a shortage number of the representative transform coefficients with reference to the predetermined number performing processing to extract a transform coefficient again by using the updated threshold; and calculating, for each of the extension-band subbands, a value of correlation between the representative transform coefficient and a normalized core encoded low-band transform coefficient, and selecting a subband having a largest value of correlation when the number of the extracted representative transform coefficients reaches the predetermined number.

Advantageous Effects of Invention

According to the present invention, the number of loops required to extract a predetermined number N of transform coefficients can be reduced and therefore the amount of calculation for extracting the transform coefficients can also be reduced, drastically.

DESCRIPTION OF EMBODIMENTS

Embodiments of the present invention will be described in detail below in reference to the accompanying drawings.

When N transform coefficients having a large amplitude are extracted from among the transform coefficients in the extension bend, a coding apparatus according to the present embodiment statistically calculates such a high threshold that the number of extracted transform coefficients does not teach N transform coefficients at first, and then uses the calculated threshold to extract transform coefficients having a large amplitude. Next, the coding apparatus lowers the threshold in accordance with how many more transform coefficients have to be extracted to obtain N transform coefficients, and then uses the newly calculated threshold to extract transform coefficients having a large amplitude. The coding apparatus repeats the threshold calculation and the extraction of transform coefficients until N transform coefficients are extracted. This can reduce the number of loops required to extract N transform coefficients, resulting in a significant reduction in the amount of calculation for extracting transform coefficients. In addition, determining how much the threshold is lowered in accordance with how many more transform coefficients have to be extracted to obtain N transform coefficients makes it possible to reduce variation in the number of extracted transform coefficients, which may be very wide in the case where transform coefficients are extracted based on statistical processing alone, and therefore to perform encoding without loss of coding quality.

Figure 1:
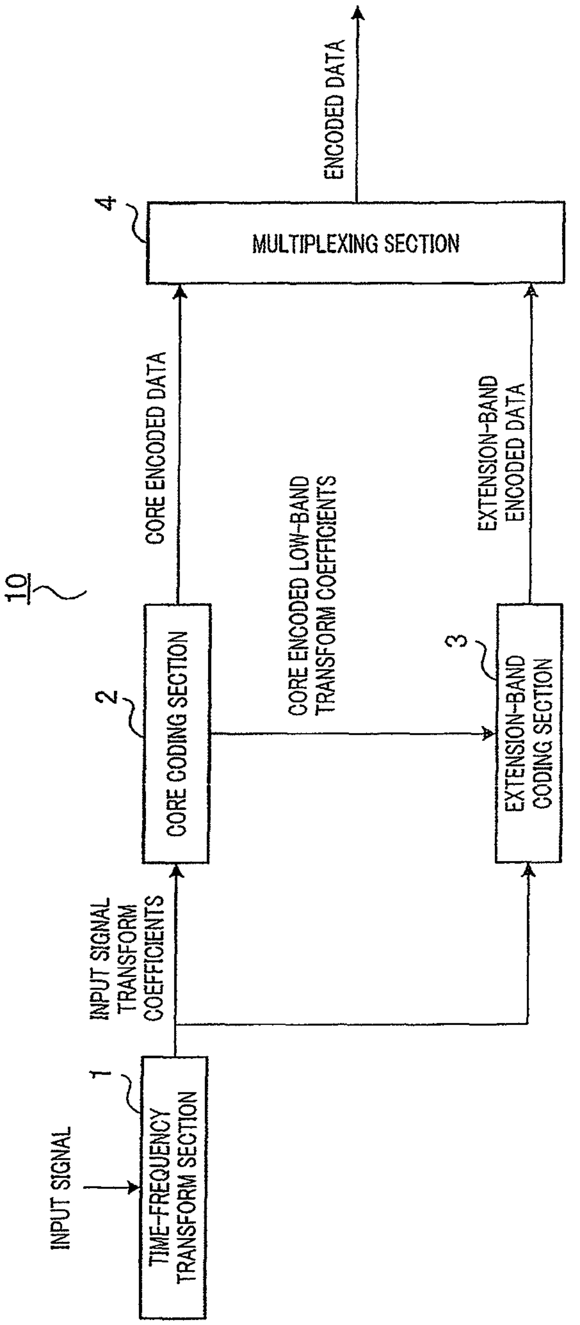
FIG. 1 is a block diagram illustrating a configuration of a coding apparatus according to an embodiment of the present invention.

A description will be given of components of the coding apparatus according to the present embodiment below. FIG. 1 is a block diagram that illustrates a configuration of the coding apparatus according to the present embodiment.

As shown in FIG. 1, coding apparatus 10 mainly includes time-frequency transform section 1, core coding section 2, extension-band coding section 3, and multiplexing section 4.

Time-frequency transform section 1 transforms an input signal from the time domain to the frequency domain and outputs the obtained input signal transform coefficients to core coding section 2 and extension-band coding section 3. It should be noted that although the present embodiment is described for the case where the MDCT transformation is used, the present invention is not limited to the MDCT transformation and an orthogonal transform such as FFT (Fast Fourier Transform) and DCT (Discrete Cosine Transform) that perform transform from the time domain to the frequency domain may be used.

Core coding section 2 encodes, among the input signal transform coefficients, transform coefficients in a low band (a bend lower than a reference frequency (for example, 7 kHz)) by transform coding and outputs the encoded data to multiplexing section 4 as core encoded data. Core coding section 2 also outputs core encoded low-band transform coefficients obtained by decoding the core encoded data to extension-band coding section 3.

Extension-band coding section 3 uses the core encoded low-band transform coefficients to perform coding processing on transform coefficients in an extension band (a band higher than the reference frequency) (hereinafter referred to as "extension-band transform coefficients") among the input signal transform coefficients and outputs the obtained extension-band encoded data to multiplexing section 4. The internal configuration of extension-band coding section 3 will be described in detail later.

Multiplexing section 4 outputs encoded data obtained by multiplexing the core encoded data and the extension-band encoded data.

With the configuration described above, the coding apparatus 10 encodes an input signal and outputs encoded data.

Figure 2:
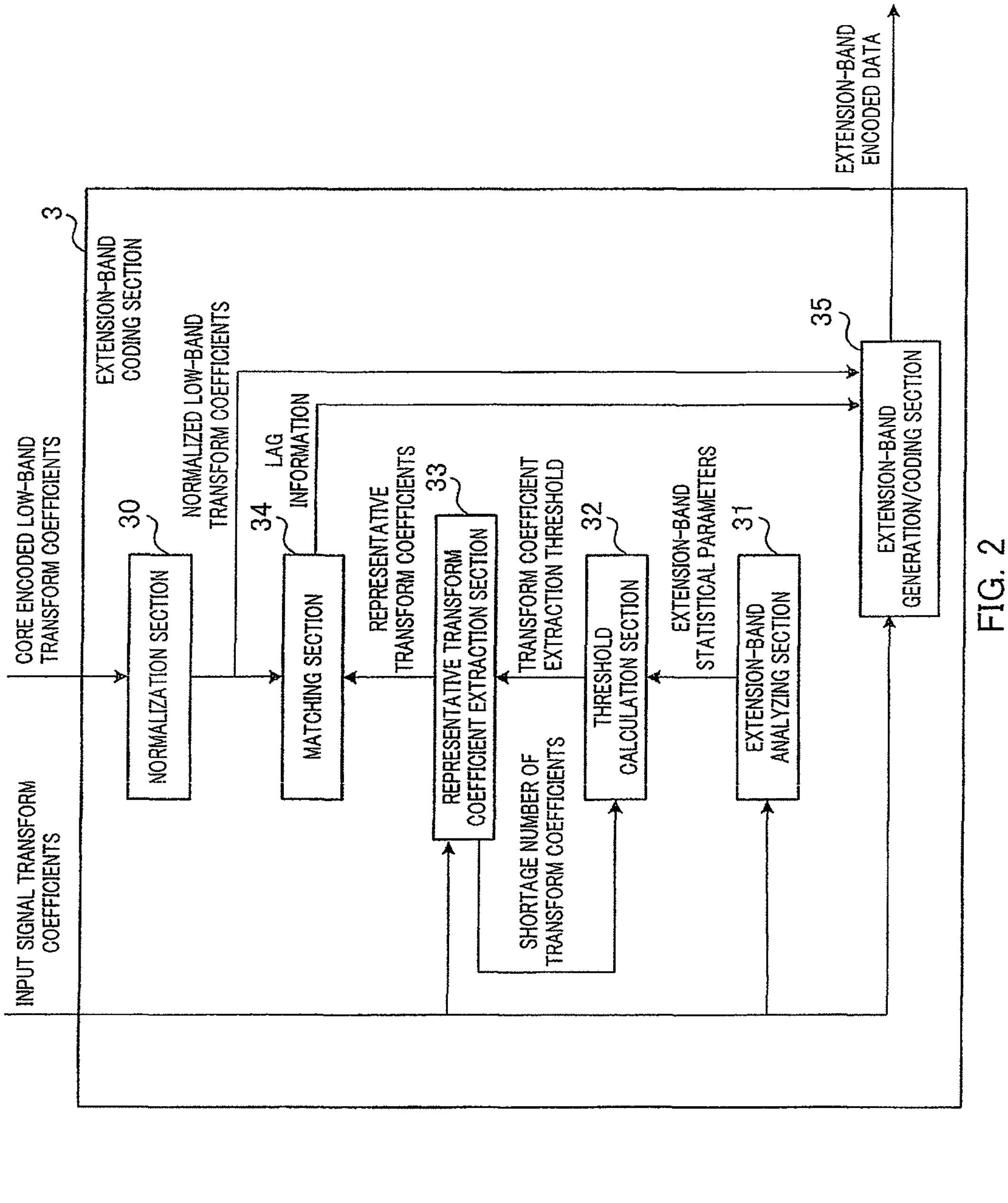
FIG. 2 is a block diagram illustrating a configuration of an extension-band coding section according to the embodiment of the present invention.

The internal configuration of extension-band coding section 3 will be described next. As shown in FIG. 2, extension-bend coding section 3 mainly includes normalization section 30, extension-bend analyzing section 31, threshold calculation section 32, representative transform coefficient extraction section 33, matching section 34, and extension-band generation/coding section 35.

Normalization section 30 normalizes the core encoded low-band transform coefficients and outputs the obtained normalized low-band transform coefficients to matching section 34 and extension-band generation/coding section 35. In general, normalization section 30 calculates the envelope of the core encoded low-band transform coefficients and obtains the normalized low-band transform coefficients by dividing the core encoded low-band transform coefficients by the envelope. It should be noted that the normalized low-band transform coefficients can also be obtained, for example, by dividing the core encoded low-bend transform coefficients into subbands, calculating subband energy, and dividing each of the transform coefficients in each subband by the subband energy.

In general, the distribution of energy is very uneven in the low-band portion of the transform coefficients while the distribution of energy is relatively uniform in the high-band portion of the transform coefficients. Thus, encoding can be performed more efficiently by calculating values of correlation with the extension-band transform coefficients after the normalization processing for smoothening out the unevenness in the distribution of energy of the core encoded low-bend transform coefficients.

Extension-band analyzing section 31 analyzes the extension-band transform coefficients and outputs the resulting statistics to threshold calculation section 32 as extension-band statistical parameters. Assuming that the extension-band transform coefficients follow the normal distribution, extension-bend analyzing section 31 calculates the mean value (hereinafter referred to as an "absolute-value mean") and the standard deviation value of absolute-value amplitudes, which are absolute values of the amplitudes, as the statistical parameters. The operation of extension-band analyzing section 31 will be described in detail later.

Threshold calculation section 32 calculates a transform coefficient extraction threshold based on the extension-band statistical parameters and outputs the calculated transform coefficient extraction threshold to representative transform coefficient extraction section 33. In addition, threshold calculation section 32 updates the transform coefficient extraction threshold in accordance with the shortage number of transform coefficients, and outputs the updated transform coefficient extraction threshold to representative transform coefficient extraction section 33. The operation of threshold calculation section 32 will be described in detail later.

For each extension-band subband, representative transform coefficient extraction section 33 extracts extension-band transform coefficients having an amplitude larger than the transform coefficient extraction threshold and outputs the extracted extension-band transform coefficients to matching section 34 as representative transform coefficients. Representative transform coefficient extraction section 33 also outputs the shortage number of transform coefficients to threshold calculation section 32 when the number of representative transform coefficients is less than the predetermined number N. The operation of representative transform coefficient extraction section 33 will be described in detail later.

Matching section 34 calculates a value of correlation between the representative transform coefficients and the normalized low-band transform coefficients for each extension-band subband, selects a subband having the largest value of correlation, and outputs information indicating the selected subband to extension-bend generation/coding section 35 as lag information.

Extension-band generation/coding section 35 uses the extension-bend transform coefficients, the lag information, and the normalized low-band transform coefficients to generate extension-band encoded data and outputs the generated extension-bend encoded data. In particular, extension-band generation/coding section 35 copies the normalized low-band transform coefficients in the subband indicated by the lag information to the extension band and utilizes the copied normalized low-band transform coefficients as a frequency fine structure of the extension band. Extension-band generation/coding section 35 encodes the lag information used for this copying operation and includes the encoded lag information in the extension-band encoded data. Furthermore, extension-band generation/coding section 35 calculates a gain, which is an amplitude ratio (the square root of an energy ratio) between the extension-band transform coefficients obtained by copying the normalized low-band transform coefficients and the extension-band transform coefficients that are transform coefficients in the extension band among the input signal transform coefficients, encodes the gain, and includes the encoded gain in the extension-band encoded data. Extension-band generation/coding section 35 multiplies the extension-band transform coefficients obtained by copying the normalized low-band transform coefficients by the calculated gain to obtain the extension-band transform coefficients.

The operation of extension-band analyzing section 31, threshold calculation section 32, and representative transform coefficient extraction section 33 will be described in detail next. Assuming that the extension-band transform coefficients follow the normal distribution in the present embodiment, how to set the transform coefficient extraction threshold (hereinafter simply referred to as the "threshold") in a stepwise manner will be described.

When the extension-band transform coefficients are assumed to follow the normal distribution, extension-band analyzing section 31 outputs the absolute-value mean and the standard deviation of amplitudes of the transform coefficients for each extension-band subband as the extension-bend statistical parameters.

Extension-band analyzing section 31 calculates the absolute-value mean by equation 1 below. In equation 1, j is the index of a subband, the total number of transform coefficients included in each extension-band subband is M, and i (i=1 to M) is the index of a transform coefficient included in each subband. Fhavg(j) represents the absolute-value mean of transform coefficients included in a subband j and Fh represents the amplitude of an extension-band transform coefficient. That is, Fh(j, i) represents the amplitude of the i-th extension-band transform coefficient included in the j-th subband. For ease of explanation, it is assumed that the number of transform coefficients included in every subband of the extension-band transform coefficients is M.

[1]

$$Fhavg(j) = \sum_{i=1}^{M} |Fh(i, j)|/M \quad \text{(Equation 1)}$$

Next, extension-bend analyzing section 31 calculates the standard deviation for each subband. The standard deviation is calculated by equation 2 below. In equation 2, σ(i) represents the standard deviation of a subband j.

[2]

$$\sigma(j) = \sqrt{\left(\sum_{i=1}^{M} Fh(i, j)^2/M\right) - Fhavg(j)^2} \quad \text{(Equation 2)}$$

Extension-band analyzing section 31 outputs the calculated absolute-value mean and the standard deviation to threshold calculation section 32 as the extension-band statistical parameters.

Threshold calculation section 32 performs different calculations in accordance with whether the initial threshold is calculated or the existing threshold is lowered. The calculation of the initial threshold will now be described.

Threshold calculation section 32 determines the initial threshold based on the extension-band statistical parameters. When the extension-band transform coefficients are assumed to follow the normal distribution, threshold calculation section 32 calculates the threshold by equation 3 below. In equation 3, Fhthr(j) is the threshold for a subband j and β is a constant for controlling the threshold. For example, β is set to about 1.6 to extract the largest 10% of the extension-bend transform coefficients or about 2.0 to extract the largest 5% of the extension-band transform coefficients. The set value of β can be calculated according to the normal distribution table. In this calculation, threshold calculation section 32 extracts a relatively large value of β such that the initial threshold is relatively high to prevent the threshold from being too low, with the result that the number of extracted extension-band transform coefficients becomes equal to or exceeds the predetermined number. For example, in order to extract N extension-band transform coefficients from among M extension-bend transform coefficients, β is set to a value with which N or less extension-band transform coefficients are expected to be extracted when the extraction processing is actually performed, i.e., β is set to a value with which P extension-band transform coefficients are to be extracted, where P is less than N.

$$\text{Fhthr}(j)=Fh\text{avg}(j)+\sigma(j)*\beta \quad \text{(Equation 3)}$$

The operation of threshold calculation section 32 for lowering the threshold will be described later.

For each extension-band subband, representative transform coefficient extraction section 33 compares the amplitude of the extension-band transform coefficients with the threshold set by threshold calculation section 32 to extract the extension-band transform coefficients having an amplitude larger than the threshold. Representative transform coefficient extraction section 33 stores the extracted extension-band transform coefficients as the representative transform coefficients and outputs how many more representative transform coefficients have to be extracted to obtain a predetermined number of transform coefficients to threshold calculation section 32 as the shortage number of transform coefficients.

If the number of extracted representative transform coefficients reaches the predetermined number, then representative transform coefficient extraction section 33 stops the extraction processing and outputs the extracted representative transform coefficients to matching section 34. Otherwise if the number of extracted representative transform coefficients does not reach the predetermined number, representative transform coefficient extraction section 33 stores the extracted extension-band transform coefficients as the representative transform coefficients. At this point, representative transform coefficient extraction section 33 stores all the extension-band transform coefficients in the subband with the amplitude of the already-extracted representative transform coefficients set to zero as an extraction candidate transform coefficient group. This can prevent the already-extracted extension-band transform coefficients to be extracted again in the next extraction processing.

If the number of extracted representative transform coefficients does not reach the predetermined number, representative transform coefficient extraction section 33 performs additional extraction of transform coefficients. In this case, representative transform coefficient extraction section 33 performs the extraction processing not on all the extension-band transform coefficients included in the subband but on the extraction candidate transform coefficient group. The newly-extracted extension-band transform coefficients are added to the stored representative transform coefficients and the shortage number of transform coefficients decreases by the number of the added representative transform coefficients.

In the additional extraction of representative transform coefficients by this stepwise processing, when the number of extracted representative transform coefficients reaches the predetermined number and the extraction processing stops, there may be an extension-band transform coefficient having an amplitude larger than the newly-extracted extension-band transform coefficients in a band that has not been searched yet in the additional extraction processing. However, since in the initial step (i.e., the extraction processing initially performed before the additional extraction of transform coefficients), extension-band transform coefficients having an amplitude larger then the extension-band transform coefficients in the unsearched band are extracted, even if extension-band transform coefficients in the unsearched band cannot be extracted, it has little impact on the whole extraction processing.

The predetermined number is not limited to one fixed number and may be set in a range of numbers. For example, the predetermined number is set to N as a reference, and when the number of extracted extension-band transform coefficients reaches a range between N−δ and N+δ as a result of the extraction processing by using a calculated threshold, the calculation of a new threshold may stop and the extraction processing of transform coefficients may end.

The operation performed when the number of extension-bend transform coefficients extracted by representative transform coefficient extraction section 33 is less than the predetermined number will be described in detail next.

Threshold calculation section 32 controls the threshold adaptively based on the shortage number of transform coefficients outputted from representative transform coefficient extraction section 33, so as to extract more extension-band transform coefficients. In particular, threshold calculation section 32 lowers the threshold greatly when the shortage number of transform coefficients is large and lowers the threshold slightly when the shortage number of transform coefficients is small.

Updating the threshold by means of multiplication by a suppression coefficient that is calculated in accordance with the shortage number of transform coefficients will be described herein as an example of techniques for adapting the shortage number of transform coefficients. In equation 4 below, Sc(j) represents a suppression coefficient in a subband j, Nlp(j) represents the shortage number of transform coefficients in the subband j, a represents a minimum amount of suppression, and b represents a maximum amount of suppression. $1.0 \geq a > b > 0.0$ for a and b.

[4]

$$Sc(j) = -\frac{a-b}{N} * Nlp(j) + a \quad \text{(Equation 4)}$$

[5]

$$Fhthr(j) = Fhthr(j) * Sc(j) \quad \text{(Equation 5)}$$

In this manner, the threshold is adaptively lowered in accordance with the shortage number of transform coefficients. For example, if a=0.9 and b=0.5, Fhthr(j) in equation 5 is suppressed to a range between 0.9 times and 0.5 times the current value of Fhthr(j).

The threshold calculated as described above is outputted to representative transform coefficient extraction section 33. The above-described operation of threshold calculation section 32 is repeated until the number of representative transform coefficients extracted by representative transform coefficient extraction section 33 reaches the predetermined number.

For example, if the threshold is updated two times (if three thresholds, including the initial threshold, are used for the extraction processing) to extract N, which is the predetermined number, representative transform coefficients, when the number of transform coefficients in the subband is M, the extraction processing according to the above-described approach requires only the amount of calculation for performing branching processing M×3 times.

Figure 3:
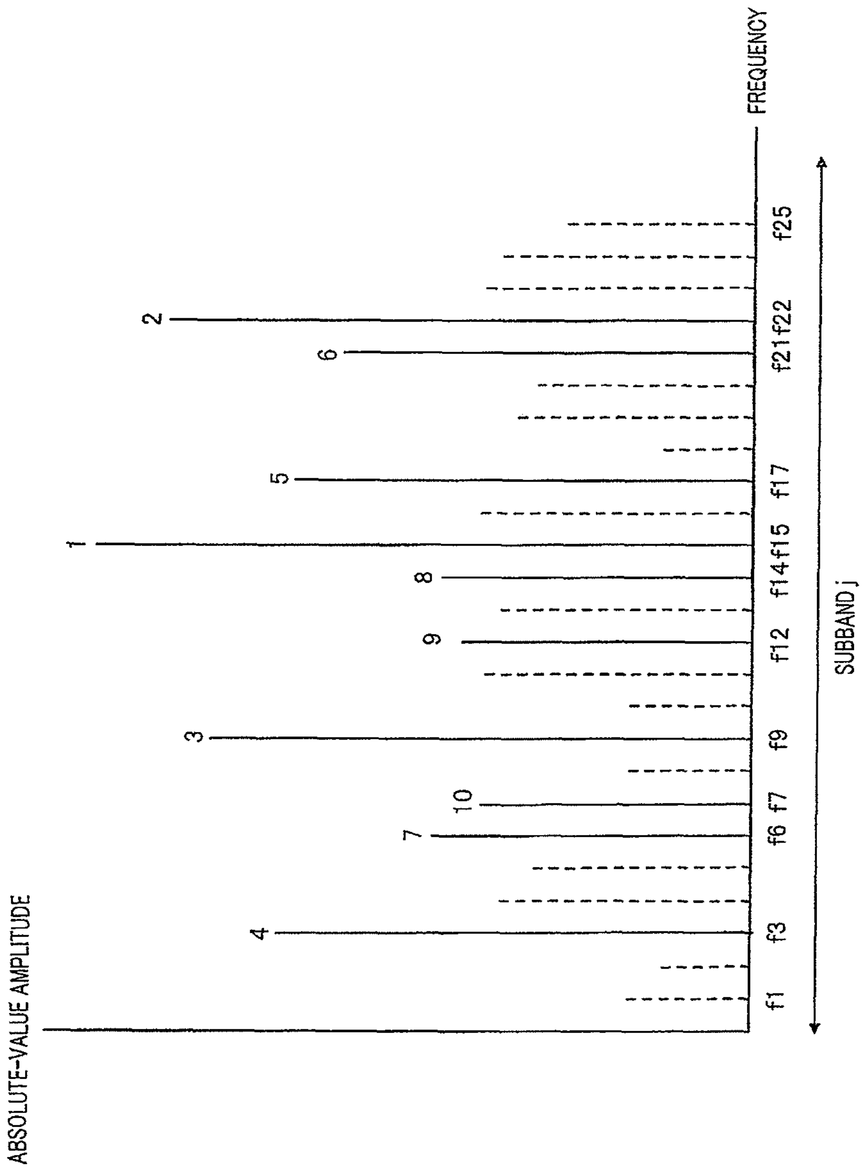
FIG. 3 illustrates the operation of extraction processing of transform coefficients according to the technique according to the related art.

The operation of updating the transform coefficient extraction threshold as described above and the associated extraction processing will be described next in reference to FIG. 3 and FIG. 4. FIG. 3 illustrates extraction processing according to a conventional technique and FIG. 4 illustrates the extraction processing according to the present embodiment.

Figure 4:
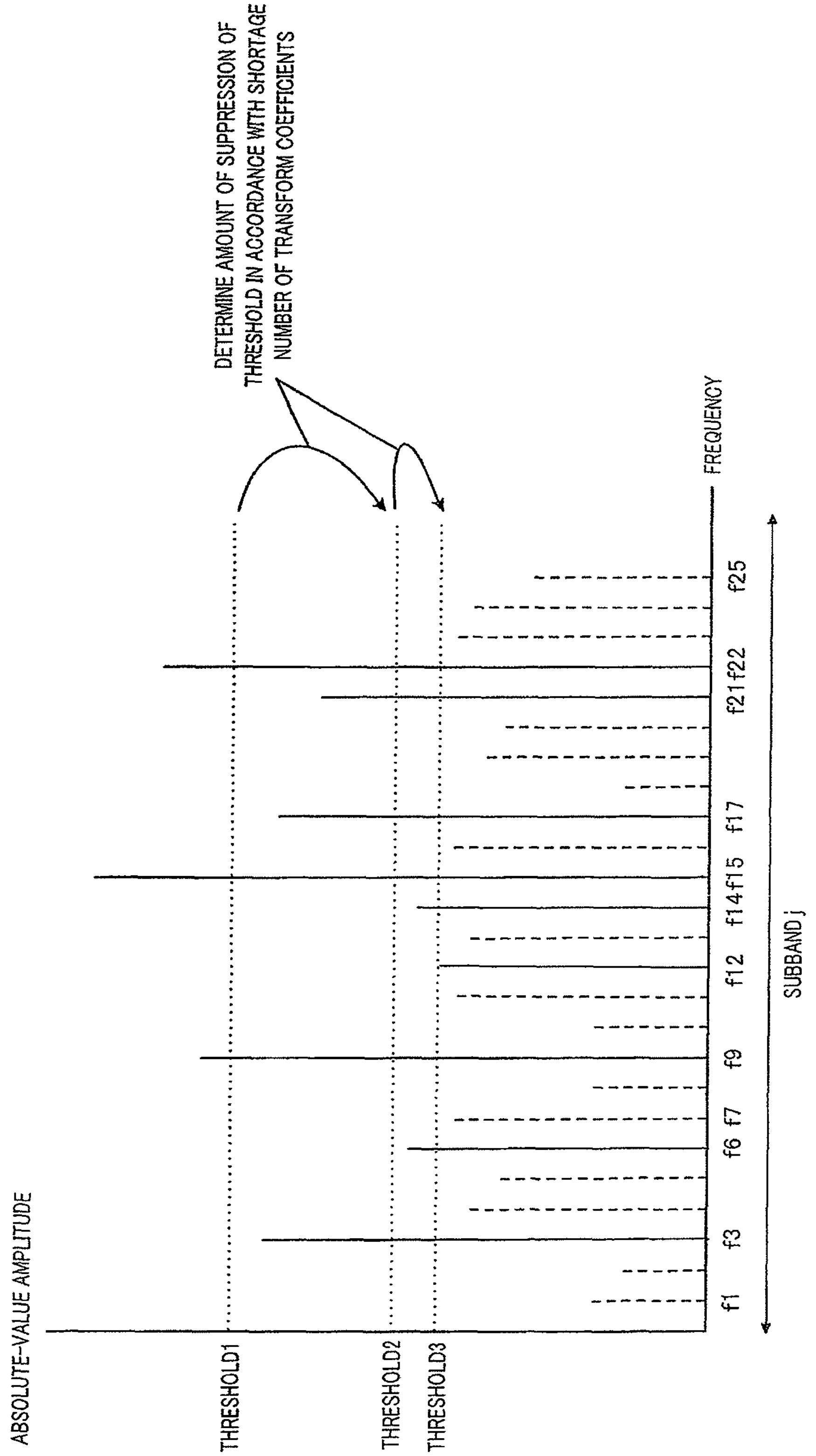
FIG. 4 illustrates the operation of extraction processing of transform coefficients according to the embodiment of the present invention.

The horizontal axis of FIG. 3 and FIG. 4 represents the frequency and the horizontal axis of FIG. 3 and FIG. 4 represents the absolute-value amplitude which indicates extension-band transform coefficients in a subband j. As an example for illustration, the number of transform coefficients included in the subband M=25 and the predetermined number N=10. Extension-band transform coefficients are denoted by f1, f2, f3 from a low band to a high bend and an extension-band transform coefficient corresponding to the highest frequency is denoted by f25.

An example of the operation of extraction processing in the technique according to the related art will be described in reference to FIG. 3. In this technique, since extension-band transform coefficients are extracted in descending order of the absolute-value amplitude, ten extension-band transform coefficients f15, f22, f9, f3, f17, f21, f6, f14, f12, and f7 are extracted in this order. This extraction processing has to perform branching processing M×10 times.

The operation of the extraction processing according to the present embodiment will be described next in reference to FIG. 4. The absolute-value mean and the standard deviation of f1 to f25 are calculated by extension-band analyzing section 31 and a transform coefficient extraction threshold is calculated by threshold calculation section 32. This transform coefficient extraction threshold is denoted by threshold1 in FIG. 4.

At this point, three extension-band transform coefficients f15, f22, and f9 are extracted and the shortage number of transform coeficients is 10−3=7. If a=0.9 and b=0.5, a suppression coefficient Sc(j)=0.62 according to equation 4 above. As a result, the transform coefficient extraction threshold is updated with 0.62×threshold1. This new transform coefficient extraction threshold is denoted by threshold2.

The extraction with the use of threshold2 provides three additionally extracted extension-band transform coefficients f3, f17, f21 and the shortage number of transform coefficients is 7−3=4. As a result, the suppression coefficient Sc(j) becomes 0.78 and the transform coefficient extraction threshold is updated with 0.78×threshold2. This new transform coefficient extraction threshold is denoted by threshold3.

The extraction with the use of threshold3 provides three additionally extracted extension-band transform coefficients f6, f14, f12 and the shortage number of transform coefficients is 4−3=1. The number of extracted extension-band transform coefficients is nine, which is less than ten, but assumed to be in an allowable range to stop the extraction processing.

In the above example, the transform coefficients can be extracted by performing the extraction processing three times (branching processing M×3 times) with the transform coefficient extraction threshold initially set once and updated twice. In this illustrative example, f7, which is extracted by the method according to the related art, cannot be extracted, according to the present embodiment. However, since f7 has an absolute-value amplitude smaller than that of the extracted nine transform coefficients, even if f7 cannot be extracted, it has little impact on the accuracy of calculation of a value of correlation.

The configuration and operation described above allow extension-band coding section 3 to extract an appropriate number of representative transform coefficients from among extension-band transform coefficients with a small amount of calculation when a value of correlation between the extension-band transform coefficients and the normalized low-band transform coefficients is calculated. This enables a coding apparatus that has reduced the amount of calculation without degradation of performance.

As described above, the coding apparatus according to the present embodiment calculates a threshold based on statistics on extension-band transform coefficients first and then extracts extension-band transform coefficients having a large amplitude by using the threshold. If the number of extracted extension-band transform coefficients is less than a predetermined number, the coding apparatus determines how much the threshold is lowered in accordance with the shortage number of transform coefficients and updates the threshold. The coding apparatus repeats the update of the threshold and the extraction of extension-band transform coefficients until the number of extracted extension-bend transform coefficients reaches the predetermined number. Thus, the coding apparatus can extract a required number of transform coefficients representative of the features of an extension band with a smaller amount of calculation. In other words, the amount of calculation for extracting transform coefficients can be reduced significantly by reducing the number of loops required to extract a predetermined number N of extension-bend transform coefficients.

The coding apparatus according to the present embodiment sets the threshold such that the number of the first extracted extension-bend transform coefficients is less than the predetermined number. The coding apparatus updates the threshold in accordance with how many more extension-band transform coefficients have to be extracted to obtain a predetermined number of extension-band transform coefficients, and adds extension-band transform coefficients extracted by using the updated threshold to a group of extension-band transform coefficients extracted by using the threshold before the update. The coding apparatus stops the extraction processing once the number of extension-band transform coefficients extracted during the extraction processing reaches the predetermined number. This extraction processing of extension-band transform coefficients can reliably extract extension-band transform coefficients having a large amplitude.

The coding apparatus according to the present embodiment may limit the number of times the threshold is updated to a fixed number and stop the extraction processing if the number of times the threshold is updated reaches the limit (fixed number). This can further reduce the amount of calculation in the worst case.

Figure 5:
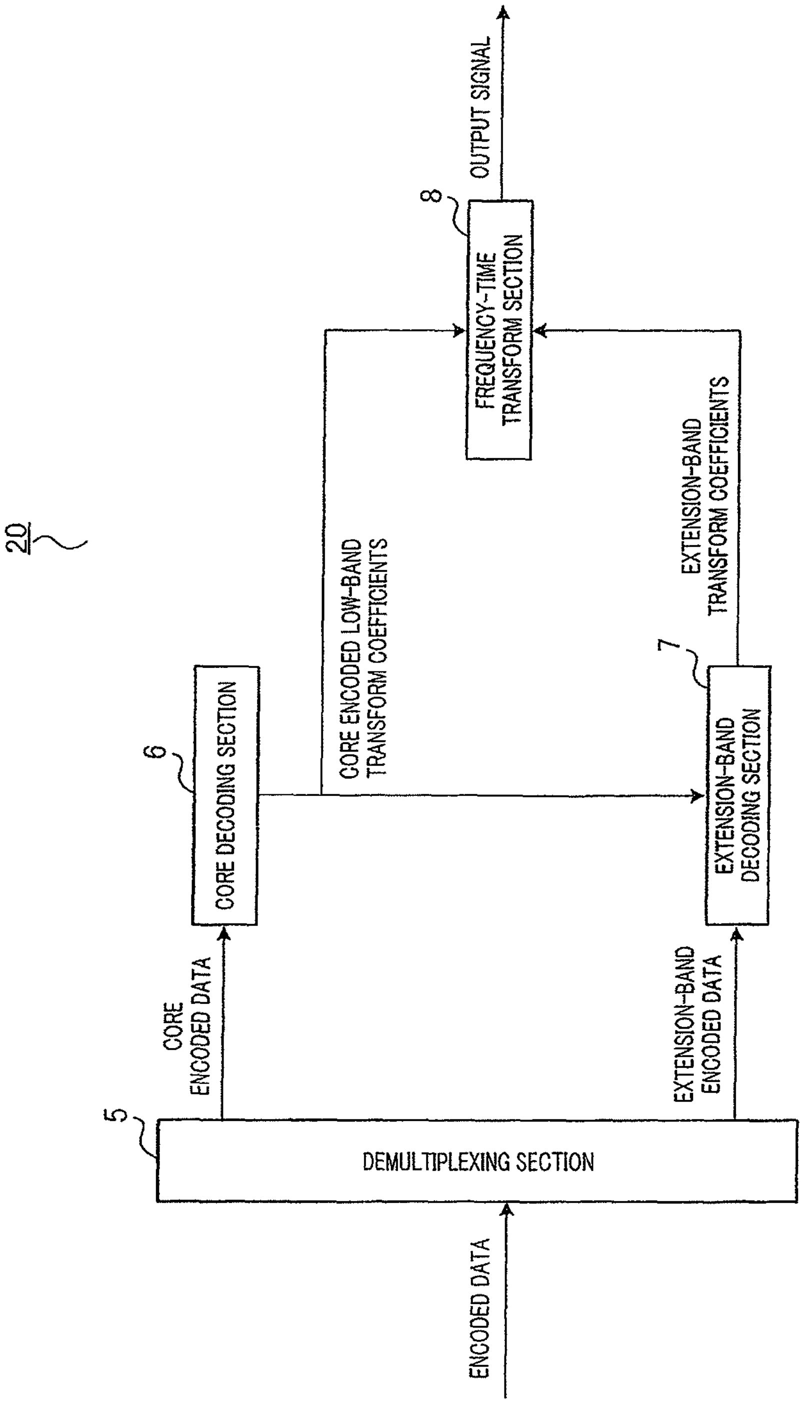
FIG. 5 is a block diagram illustrating a configuration of a decoding apparatus according to the embodiment of the present invention.

A decoding apparatus according to the present embodiment will be described next. FIG. 5 is a block diagram that illustrates a configuration of the decoding apparatus according to the present embodiment.

Decoding apparatus 20 mainly includes demultiplexing section 5, core decoding section 6, extension-band decoding section 7, and frequency-time transform section 8.

Demultiplexing section 5 receives encoded data outputted by coding apparatus 10, splits the encoded data into core encoded data and extension-band encoded data, outputs the core encoded data to core decoding section 6, and outputs the extension-band encoded data to extension-band decoding section 7.

Core decoding section 6 decodes the core encoded data and outputs the resulting core encoded low-band transform coefficients to extension-band decoding section 7 and frequency-time transform section 8.

Extension-band decoding section 7 decodes the extension-band encoded data, uses the resulting encoded data and the core encoded low-band transform coefficients to calculate extension-band transform coefficients, and outputs the calculated extension-band transform coefficients to frequency-time transform section 8. The internal configuration of extension-band decoding section 7 will be described in detail later.

Frequency-time transform section 8 combines the core encoded low-band transform coefficients and the extension-band transform coefficients to generate decoded transform coefficients, transforms the decoded transform coefficients into the time domain, for example, by an orthogonal transform to generate an output signal, and outputs the output signal.

Figure 6:
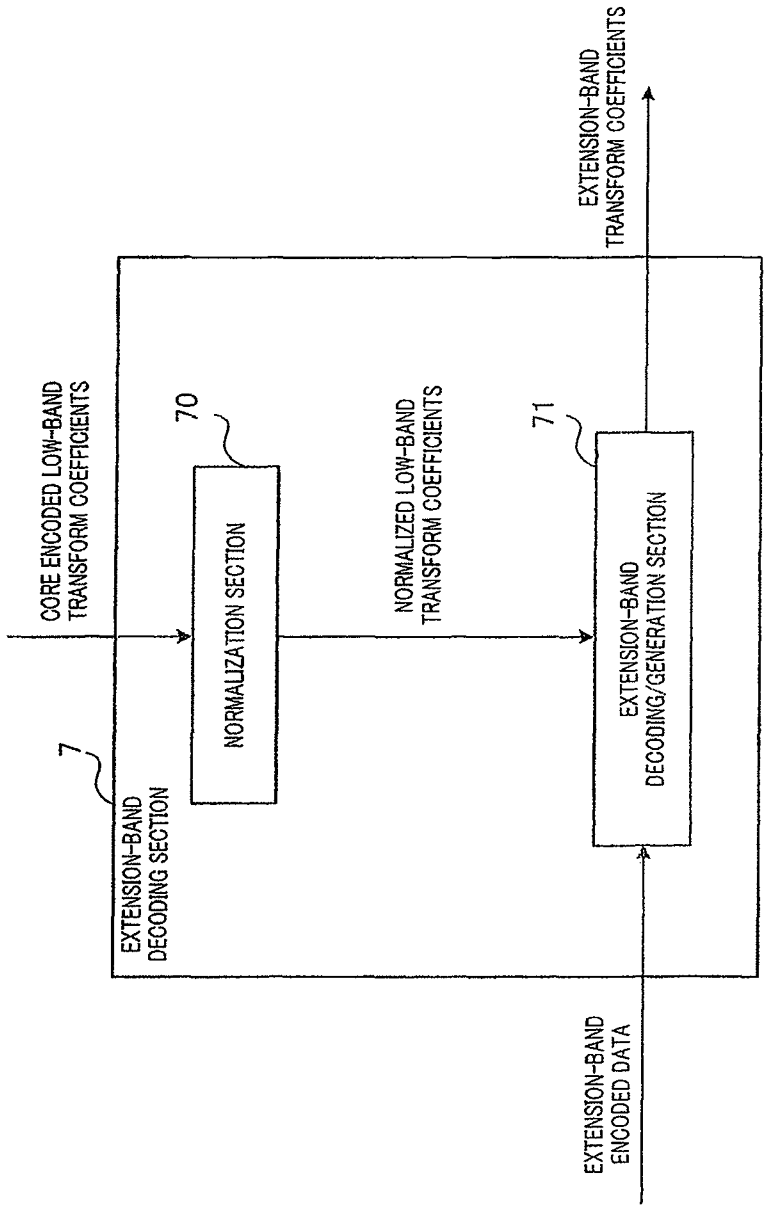
FIG. 6 is a block diagram illustrating a configuration of an extension-band decoding section according to the embodiment of the present invention.

The internal configuration of extension-band decoding section 7 will be described in detail next. As illustrated in FIG. 6, extension-band decoding section 7 mainly includes normalization section 70 and extension-bend decoding/generation section 71.

Normalization section 70 normalizes the core encoded low-band transform coefficients and outputs the normalized low-band transform coefficients. Normalization section 70 performs the same processing as normalization section 30 illustrated in FIG. 2 and thus is not described in detail.

Extension-band decoding/generation section 71 generates the extension-band transform coefficients using the normalized low-band transform coefficients and the extension-band encoded data. In particular, extension-band decoding/generation section 71 decodes lag information and a gain from the extension-band encoded data, first. Next, extension-band decoding/generation section 71 copies the normalized low-band transform coefficients to the extension bend as a frequency fine structure according to the lag information. Then, extension-band decoding/generation section 71 multiplies the extension-band transform coefficients copied from the normalized low-band transform coefficients by the decoded gain to generate the extension-band transform coefficients.

The configuration and operation described above allows decoding apparatus 20 according to the present embodiment to decode encoded data generated by coding apparatus 10.

The coding apparatus and decoding apparatus according to the present embodiment have been described above. It should be noted that the above description of the present embodiment is an example of implementing the present invention and the present invention is not limited to this example.

For example, although the present embodiment is described above using an example in which threshold calculation section 32 and representative transform coefficient extraction section 33 operate repeatedly until the number of extracted transform coefficients reaches a required number, the present invention is not limited to this example. Representative transform coefficient extraction section 33, for example, may determine that the extraction of more transform coefficients is not needed when the extraction is repeated a fixed number of times, and end the extraction processing after outputting the already-extracted representative transform coefficients.

In the present embodiment above, the calculation of extension-band transform coefficients is described using an example in which the transform coefficient extraction threshold is updated in the same manner in all subbands, but in the present invention, the transform coefficient extraction threshold may be updated to a degree that varies for each subband. For example, the probability of extracting transform coefficients may be reduced in a higher band by setting at least one of a and b in the above equation 4 larger in a higher band. This approach enables further reduction in the amount of calculation by taking advantage of a fact that the fine structure of transform coefficients has smaller impact in a higher band.

In the present invention, as the number of loops for updating the threshold as described above increases, the threshold may be set in different manners. For example, as the number of loops increases, at least one of a and b in the above equation 4 is decreased to lower the threshold, which allows more transform coefficients to be extracted to reach the predetermined number and solve the shortage of transform coefficients.

The present embodiment is described above for the case where extension-band transform coefficients are assumed to follow the normal distribution and threshold calculation section 32 illustrated in FIG. 2 calculates the threshold from an absolute-value mean and a standard deviation. In the present invention, however, extension-band transform coefficients may be assumed to follow a distribution other than the normal distribution and the threshold may be set in accordance with the distribution. Moreover, in the present invention, the absolute value of the largest amplitude of transform coefficients included in a subband that is multiplied by a fixed rate less than 1.0 may be used as the threshold.

Although in the present embodiment, a technique for updating the threshold by threshold calculation section 32 illustrated in FIG. 2 is described, in which the threshold is updated by multiplying the threshold by a suppression coefficient calculated in accordance with the shortage number of transform coefficients, in the present invention, another technique may be used for updating the threshold. For example, the threshold can be updated by subtracting 0.2 from the threshold when the shortage number of transform coefficients is large and subtracting 0.1 from the threshold when the shortage number of transform coefficients is small, or by subtracting 0.5 from $\beta$ when the shortage number of transform coefficients is large and subtracting 0.1 from $\beta$ when the shortage number of transform coefficients is small.

If the number of extracted transform coefficients is more than the predetermined number when representative transform coefficient extraction section 33 illustrated in FIG. 2 performs extraction processing by using the threshold calculated based on extension-band statistical parameters from extension-band analyzing section 31, representative transform coefficient extraction section 33 may cancel the transform coefficient extraction and issue an instruction back to threshold calculation section 32 to increase the threshold. In this case, threshold calculation section 32 updates the threshold to increase and representative transform coefficient extraction section 33 can perform the extraction processing again by using the updated threshold to extract a predetermined number of or less transform coefficients.

Although the present embodiment is described above using an example in which threshold calculation section 32 illustrated in FIG. 2 sets a relatively large threshold such that the number of the first extracted transform coefficients is equal to or less than the predetermined number, in the present invention, threshold calculation section 32 may set a threshold such that the number of the first extracted transform coefficients is equal to the predetermined number. In this case, the number of the first extracted transform coefficients may often exceed the predetermined number. In such cases, where the number of extracted transform coefficients exceeds the predetermined number, representative transform coefficient extraction section 33 instructs threshold calculation section 32 to increase the threshold and performs extraction processing again by using the updated threshold. This process is repeated until the number of extracted transform coefficients becomes equal to or less than the predetermined number.

Although the present embodiment is described above using an example in which a value of correlation between representative transform coefficients among extension-band transform coefficients and normalized low-band transform coefficients is calculated, in the present invention, modified extension-band transform coefficients may be used. For example, extension-band transform coefficients filtered in consideration of influences of auditory masking and the like may be used.

The present invention is also applicable to cases where a signal processing program is recorded and written to a machine-readable recording medium such as memory, disk, tape, CD, and DVD, and is operated, and operations and effects similar to those in each of the above-mentioned embodiments can be obtained in this case.

Also, although cases have been described with the above embodiment as examples where the present invention is configured by hardware, the present invention can also be implemented by software.

Bach function block employed in the description of the aforementioned embodiment may typically be implemented as an LSI constituted by an integrated circuit. These functional blocks may be individual chips or partially or totally contained on a single chip. "LSI" is adopted here but this may also be referred to as "IC," "system LSI," "super LSI," or "ultra LSI" depending on differing extents of integration.

Further, the method of circuit integration is not limited to LSI, and implementation using dedicated circuitry or general purpose processors is also possible. After LSI manufacture, utilization of a programmable FPGA (Field Programmable Oate Array) or a reconfigurable processor where connections and settings of circuit cells within an LSI can be reconfigured is also possible.

Further, if integrated circuit technology comes out to replace LSI as a result of the advancement of semiconductor technology or a technology derivative of semiconductor technology, it is naturally also possible to carry out function block integration using this technology. Application of biotechnology is also possible.

The disclosure of Japanese Patent Application No. 2011-237818, filed on Oct. 28, 2011, including the specification, drawings, and abstract, is incorporated herein by reference in its entirety.

INDUSTRIAL APPLICABILITY

The coding apparatus according to the present invention is suitable for encoding sound-related data such as speech data, music data, and audio data.

REFERENCE SIGNS LIST

1 Time-frequency transform section
2 Core coding section
3 Extension-band coding section
4 Multiplexing section
5 Demultiplexing section
6 Core decoding section
7 Extension-band decoding section
8 Frequency-time transform section
10 Coding apparatus
20 Decoding apparatus
30 Normalization section
31 Extension-bend analyzing section
32 Threshold calculation section
33 Representative transform coefficient extraction section
34 Matching section
35 Extension-band generation/coding section
70 Normalization section
71 Extension-band decoding/generation section

The invention claimed is:

1. A coding apparatus comprising:

a core coding section that encodes transform coefficients in a band lower than a reference frequency among input signal transform coefficients acquired by transforming an input signal from a time domain to a frequency domain; and an extension-band coding section that encodes transform coefficients in an extension band by using core encoded low-band transform coefficients acquired by decoding data encoded by the core coding section, the extension band being a band higher than the reference frequency, wherein the extension-band coding section comprises:

a threshold calculation section that calculates, for each of extension-band subbands acquired by splitting the extension band, a threshold based on statistics on transform coefficients comprised in the subband;

a representative transform coefficient extraction section that compares, for each of the extension-band subbands, an amplitude of the transform coefficients with the threshold to extract a transform coefficient with an amplitude larger than the threshold, as a representative transform coefficient; and a matching section that calculates, for each of the extension-band subbands, a value of correlation between the representative transform coefficient and a normalized core encoded low-band transform coefficient and selects a subband with a largest value of correlation, wherein:

the threshold calculation section updates, when a number of the representative transform coefficients extracted by the representative transform coefficient extraction section is less than a predetermined number, the threshold in accordance with a shortage number of the representative transform coefficients with reference to the predetermined number; and the representative transform coefficient extraction section performs processing to extract a transform coefficient again by using the updated threshold.

2. The coding apparatus according to claim 1, wherein the threshold calculation section updates the threshold such that a smaller threshold is set for a larger shortage number of the representative transform coefficients with reference to the predetermined number.

3. The coding apparatus according to claim 1, wherein the threshold calculation section first sets the threshold such that the threshold is higher than a threshold corresponding to statistics based on which the predetermined number of representative transform coefficients are expected to be extracted.

4. The coding apparatus according to claim 1, wherein:

the threshold calculation section limits a number of times the threshold is updated to a fixed number; and the representative transform coefficient extraction section stops processing to extract the transform coefficients when the number of times the threshold is updated reaches the fixed number.

5. A coding method comprising:

a core coding step of encoding transform coefficients in a band lower than a reference frequency among input signal transform coefficients acquired by transforming an input signal from a time domain to a frequency domain; and an extension-band coding step of encoding transform coefficients in an extension band by using core encoded low-band transform coefficients acquired by decoding data encoded in the core coding step, the extension band being a band higher than the reference frequency, wherein the extension-band coding step comprises:

calculating, for each of extension-band subbands acquired by splitting the extension band, a threshold based on statistics on transform coefficients comprised in the subband;

comparing, for each of the extension-band subbands, an amplitude of the transform coefficients with the threshold to extract a transform coefficient with an amplitude larger than the threshold as a representative transform coefficient;

updating, when a number of the extracted representative transform coefficients is less than a predetermined number, the threshold in accordance with a shortage number of the representative transform coefficients with reference to the predetermined number;

performing processing to extract a transform coefficient again by using the updated threshold; and calculating, for each of the extension-band subbands, a value of correlation between the representative transform coefficient and a normalized core encoded low-band transform coefficient, and selecting a subband with a largest value of correlation when the number of the extracted representative transform coefficients reaches the predetermined number.

* * * * *